United States Patent
Higashitani et al.

(10) Patent No.: US 6,448,593 B1
(45) Date of Patent: Sep. 10, 2002

(54) TYPE-1 POLYSILICON ELECTROSTATIC DISCHARGE TRANSISTORS

(75) Inventors: Masaaki Higashitani, Sunnyvale; Hao Fang, Cupertino, both of CA (US)

(73) Assignees: Advanced Micro Devices, Inc., Sunnyvale, CA (US); Fujitsu Ltd. (JP)

(*) Notice: Subject to any disclaimer, the term of this patent is extended or adjusted under 35 U.S.C. 154(b) by 0 days.

(21) Appl. No.: 09/491,532

(22) Filed: Jan. 26, 2000

Related U.S. Application Data

(60) Provisional application No. 60/169,700, filed on Dec. 6, 1999.

(51) Int. Cl.[7] .............................................. H01L 29/02
(52) U.S. Cl. ..................... 257/288; 257/316; 257/355; 257/356; 257/360; 257/408; 438/201; 438/211; 438/230; 438/232
(58) Field of Search ................................. 257/288, 316, 257/355, 356, 360, 408; 438/211, 201, 230, 232

(56) References Cited

U.S. PATENT DOCUMENTS 4,982,250 A * 1/1991 Manos et al. ............... 257/288

\* cited by examiner

Primary Examiner—Edward Wojciechowicz
(74) Attorney, Agent, or Firm—Sawyer Law Group LLP

(57) ABSTRACT

The present invention provides a method and apparatus for providing a polysilicon type-1 ESD transistor in a flash memory chip. The method and apparatus include providing a select gate transistor that includes a gate, a floating gate, a medium doped junction, and a source and drain. The method and apparatus further include forming the source and drain by performing a lightly doped drain (LDD) mask and etch, performing a LDD spacer deposition and LDD spacer etch, and performing a N+ implant mask and a N+ implant.

7 Claims, 2 Drawing Sheets

TYPE-1 POLYSILICON ELECTROSTATIC DISCHARGE TRANSISTORS

This application claims the benefit of Provisional application Ser. No. 60/169,700, filed Dec. 6, 1999.

FIELD OF THE INVENTION

The present invention relates to transistors, and more particularly to the fabrication of electrostatic discharge transistors in Flash memory arrays.

BACKGROUND OF THE INVENTION

Flash memory chips are conveniently packaged as "flash cards," using PC Card, CompactFlash, Smart Media and similar formats. Flash memory has become widely used as film in digital cameras as well as auxiliary storage in a variety of handheld commercial and consumer devices. A flash memory chip typically includes a core area and a periphery area. The core area comprises an array of memory transistors for storing data, where each column of memory transistors is accessed by a select transistor. The transistors in the core area have a stacked gate structure, which includes a floating gate comprising a type-1 layer of polysilicon (poly 1) underneath a control gate, which comprises a type-2 layer of polysilicon (poly 2). The layer of poly 2 also forms word lines and select lines in the flash memory array. The transistors in the core area are referred to as poly 1 transistors.

The periphery area of the flash memory chip includes switching logic for the chip. Because flash memory cards are constantly inserted and removed from electronic devices, the periphery area of flash memory chips are provided with protective circuits that prevent damage due to electrostatic discharge (ESD). ESD circuits are normally placed between input/output pads and transistor gates to which the pads are connected. One type of protective circuit is referred to as an ESD transistor. The transistors in the periphery area, including the ESD transistors, have only one gate comprising a layer of poly 2. Thus, these transistors are referred to as poly 2 transistors.

An ESD transistor in the periphery area comprises a gate, source and drain, but the drain is formed by two implants. FIG. 1 is a flow chart illustrating the processing steps involved in the formation of a conventional ESD transistor in the periphery area of a flash memory. Also shown is a series of cross-sectional views of a substrate showing the resulting structure.

The process begins by depositing a layer of poly 2 on a substrate 50 in step 10. This is followed by a poly 2 mask and etch in steps 12 and 14, resulting in a poly 2 gate. After formation of the gate, a LDD mask and LDD implant are performed in steps 16 and 18 to form lightly doped drains (LDD's) 52 at the edge of the channel.

Next, an ESD implant mask and ESD implant are performed in steps 20 and 22 to form a hard MDD (medium doped drains) junction 54. This heavier second implant typically comprises arsenic at a dose of approximately $1 \times 10^{14}$ to $2 \times 10^{15}$ atoms/cm$^2$.

After formation of the hard junction 54, a layer of oxide 56 is deposited step 24. The oxide 56 is then etched to form LDD side-wall spacers 57 adjacent to the gate in step 26. After the LDD spacers are 57 formed, a N+ implant mask is performed in step 28 followed by a N+ implant in steps 30 to form N+ source and drain regions 58.

Although conventional ESD transistors adequately protect integrated circuits from electrostatic discharge, they have the disadvantage of requiring an extra ESD implant mask, which adds fabrication steps and increases cost.

Accordingly, what is needed is a transistor structure for protecting against electrostatic discharge that does not require an extra ESD implant mask. The present addresses such a need.

SUMMARY OF THE INVENTION

The present invention provides a method and apparatus for providing a polysilicon type-1 ESD transistor in a flash memory chip. The method and apparatus include providing a select gate transistor that includes a gate, a floating gate, a medium doped junction, and a source and drain. The method and apparatus further include forming the source and drain by performing a lightly doped drain (LDD) mask and etch, performing a LDD spacer deposition and LDD spacer etch, and performing a N+ implant mask and a N+ implant.

According to the method and apparatus disclosed herein, the present invention provides an ESD transistor based on a poly 1 select gate transistor, rather than a poly 2 transistor. During memory array fabrication when poly 1 select gate transistors are formed, poly 1 select gate transistors are also located in the memory array where ESD protection is desired. Thereafter, these poly 1 select gate transistors are transformed into ESD transistors, but in less processing steps than required for convention poly 2 ESD transistors.

DETAILED DESCRIPTION

The present invention is an improved transistor structure for protecting against electrostatic discharge. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

More specifically, the present invention creates an ESD transistor from a type-1 polysilicon (poly 1) transistor, rather than a traditional poly 2 transistor. Applicant's have discovered that poly 1 transistors, which are used as select gate transistors in memory arrays, are formed with a hard MDD junctions. Since a hard MDD junction is required for ESD protection, a poly 1 select gate transistor is used as the basis for forming an ESD transistor in memory arrays, which reduces the number of processing steps required.

Figure 1:
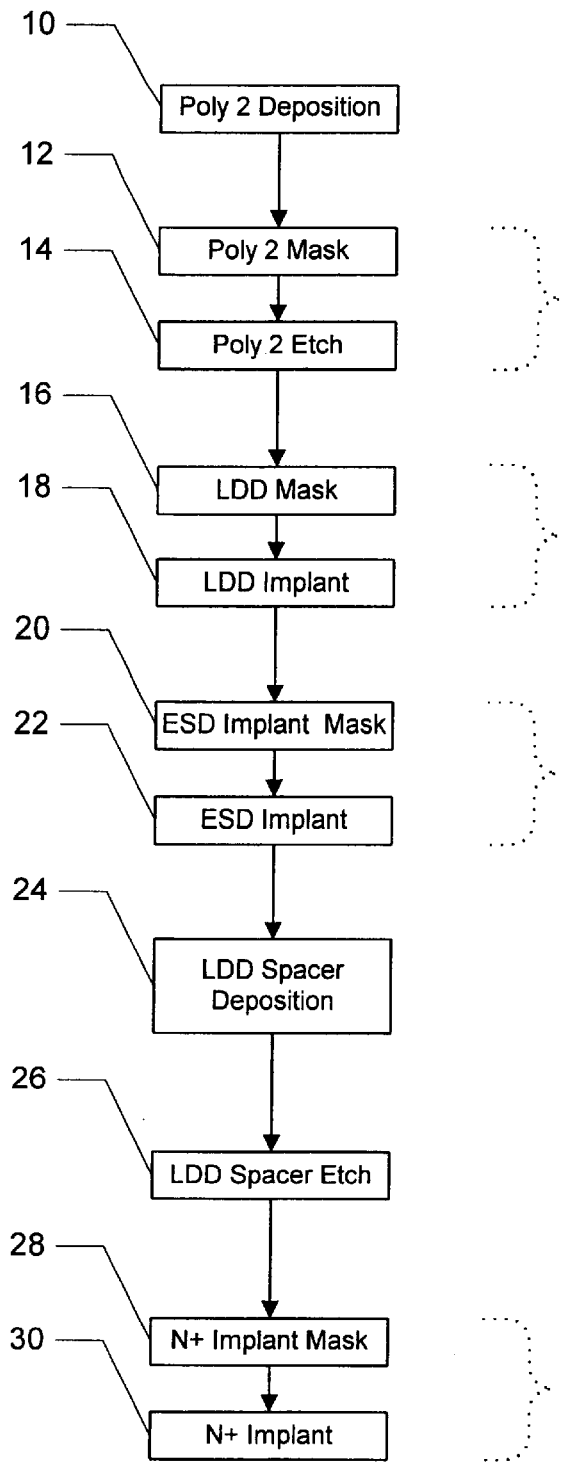
FIG. 1 is a flow chart illustrating the processing steps involved in the formation of a conventional ESD transistor, as well as a series of cross-sectional views of a substrate showing the resulting structure.
Figure 1:
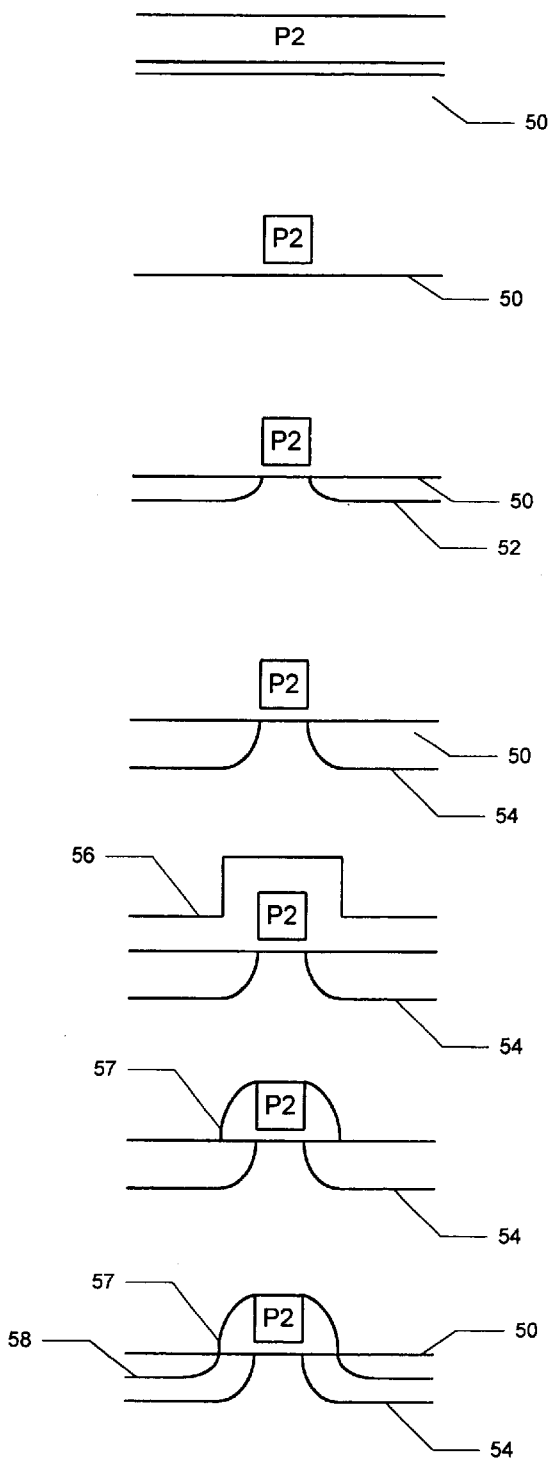
Figure 2:
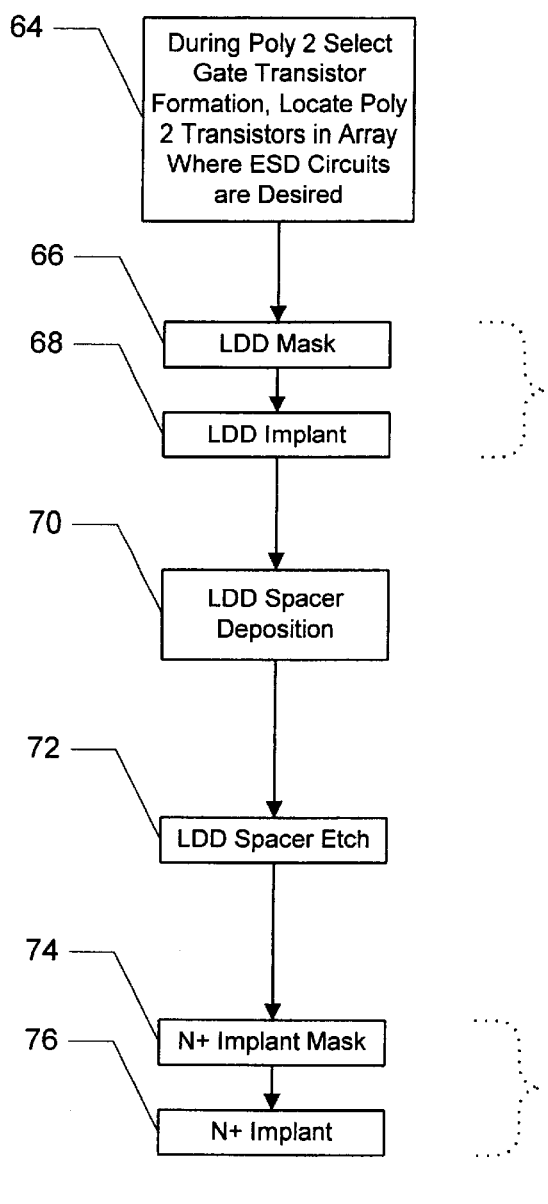
FIG. 2 is a diagram showing the processing steps involved in the formation of a poly 1 ESD transistor, as well as a series of cross-sectional views of a substrate showing the resulting structure.
Figure 2:
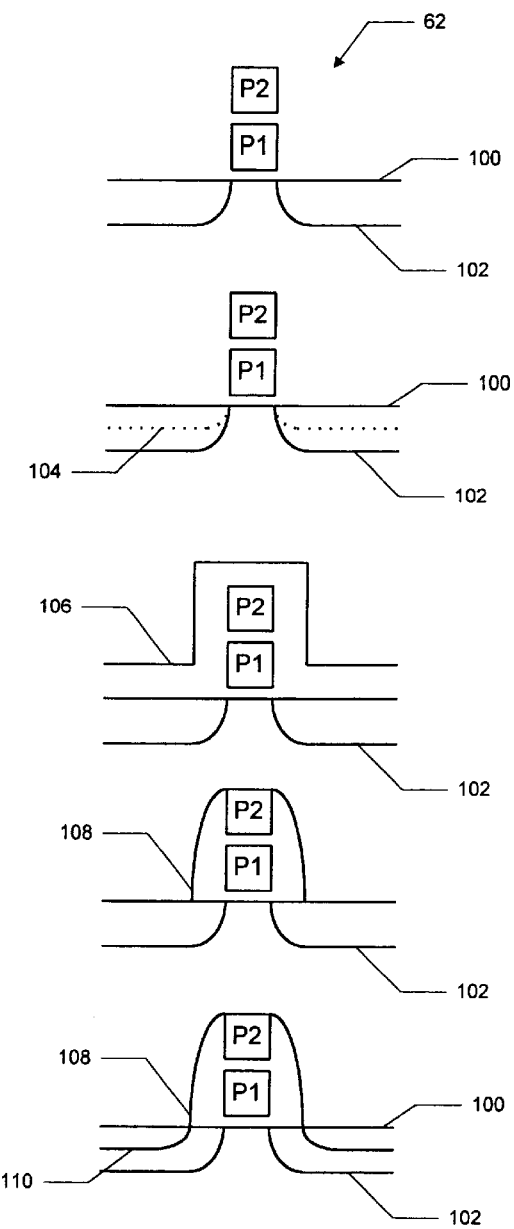

Referring now to FIG. 2, a diagram is shown illustrating the processing steps involved in the formation of a poly 1 ESD transistor in accordance with the present invention, as well as a series of cross-sectional views of a substrate showing the resulting structure.

The process begins during conventional memory array fabrication. During formation of poly 1 select gate transistors, poly 1 select gate transistors are also located in the memory array where ESD circuits are desired in step 64. As shown, a conventional poly 1 select gate transistor 62 formed on a substrate 100 includes two layers of polysilicon, a lower layer of poly 1 forming a floating gate, an upper layer of poly 2 forming a select gate, and a hard MDD junction 102, which is typically formed with Arsenic.

After the poly 2 select gate transistor is formed in a location of an ESD circuit, the poly 2 select gate transistor is transformed into a poly 2 ESD transistor as follows. First, a LDD mask and LDD implant are performed in steps 66 and 68 to form slightly doped drains (LDD's) 104 at the edge of the channel.

After the LDD implant, a layer of oxide 106 is deposited step 70. The oxide 106 is then etched to form LDD side-wall spacers 108 adjacent to the gate in step 72. After the LDD spacers are 108 formed, a N+ implant mask is performed in step 74 followed by a N+ implant in step 76 to form N+ source and drain regions 110.

According to the present invention, the result of this process is a poly 1 EDS transistor that includes a hard MDD junction, but without requiring an ESD mask and ESD implant, as in conventional ESD transistors, thereby saving two process steps.

A poly 1 EDS transistor has been disclosed. The present invention has been described in accordance with the embodiments shown, and one of ordinary skill in the art will readily recognize that there could be variations to the embodiments, and any variations are would be within the spirit and scope of the present invention. Accordingly, many modifications may be made by one of ordinary skill in the art without departing from the spirit and scope of the appended claims.

What is claimed is:

1. A method for providing an ESD transistor in a flash memory chip, the flash memory chip having a core area and a periphery area, comprising the steps of
   (a) forming select gate transistors that have a stacked gate structure in the core area;
   (b) while forming the transistors in the core area, forming an ESD transistor in the periphery area where ESD circuits are desired by providing a select gate transistor that includes a gate, a floating gate, and a medium doped junction; and
   (c) forming a source and drain for the ESD transistor by
      i) performing a lightly doped drain (LDD) mask and etch,
      ii) performing a LDD spacer deposition and LDD spacer etch, and
      iii) performing a N+ implant mask and a N+ implant.

2. The method of claim 1 wherein step (a) i) further includes the step of forming the gate with type-2 polysilicon.

3. The method of claim 2 wherein step (a) i) further includes the step of forming the floating gate with type-1 polysilicon.

4. A flash memory chip, comprising:
   a core area comprising stacked gate transistors; and
   a periphery area having at least one ESD transistor, the ESD transistor formed from a stacked gate transistor including,
      a gate,
      a floating gate,
      a medium doped junction, and
      a source and drain, wherein the source and drain are formed by performing a lightly doped drain (LDD) mask and etch, a LDD spacer deposition and LDD spacer etch, and a N+ implant mask and a N+ implant.

5. An ESD transistor as in claim 4 wherein the gate is formed with type-2 polysilicon.

6. An ESD transistor as in claim 5 wherein the floating gate is formed with type-1 polysilicon.

7. An ESD transistor as in claim 6 wherein the gate, the floating gate, and medium doped junction form a select gate transistor in a memory array.

* * * * *